US 6,583,050 B2

(12) United States Patent
Wenski et al.

(10) Patent No.: US 6,583,050 B2
(45) Date of Patent: Jun. 24, 2003

(54) SEMICONDUCTOR WAFER WITH IMPROVED FLATNESS, AND PROCESS FOR PRODUCING THE SEMICONDUCTOR WAFER

(75) Inventors: Guido Wenski, Burghausen (DE); Thomas Altmann, Burghausen (DE); Ernst Feuchtinger, Wittibreut (DE); Willibald Bernwinkler, Anzenkirchen (DE); Wolfgang Winkler, Tittmoning (DE); Gerhard Heier, Burghausen (DE)

(73) Assignee: Wacker Siltronic Gesellschaft Für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 10/218,006

(22) Filed: Aug. 13, 2002

(65) Prior Publication Data

US 2003/0045089 A1 Mar. 6, 2003

Related U.S. Application Data

(62) Division of application No. 09/491,649, filed on Jan. 27, 2000, now Pat. No. 6,458,688.

(30) Foreign Application Priority Data

Feb. 11, 1999 (DE) .......................... 199 05 737

(51) Int. Cl.[7] .......................................... H01L 21/4763
(52) U.S. Cl. .................... 438/626; 438/631; 438/645
(58) Field of Search ................. 438/471, 626, 438/631, 689, 691, 692, 706, 745, 755, 645

(56) References Cited

U.S. PATENT DOCUMENTS 3,691,694 A 9/1972 Goetz et al.
5,422,316 A 6/1995 Desai et al.
5,756,399 A 5/1998 Hajime et al.
5,942,445 A * 8/1999 Kato et al. ............... 438/691
6,214,704 B1 * 4/2001 Xin ........................ 438/471
6,293,139 B1 * 9/2001 Keller et al.

FOREIGN PATENT DOCUMENTS

| DE | 19833251 | 9/1999 |
| EP | 0 187 307 | 7/1986 |
| EP | 0 208 315 | 7/1986 |

(List continued on next page.)

OTHER PUBLICATIONS

The English Derwent Abstract 1987–008979 [02] corresp. to EP 0 208 315 is enclosed.

The English Derwent Abstract 1999–519699 [44] corresp. to DE 198 33 257 is enclosed.

Technical Report TR22.2342, E. Mendel and J.R. Hause, IBM Data Systems Division, East Fishkill, Apr. 10, 1980.

The National Technology Roadmap for Semiconductor Technology Needs, 1997, SIA, San Jose.

Primary Examiner—David Nelms
Assistant Examiner—Phuc T. Dang
(74) Attorney, Agent, or Firm—Collard & Roe, P.C.

(57) ABSTRACT

A semiconductor wafer has a front surface and a back surface and flatness values based on partial areas of a surface grid on the front surface of the semiconductor wafer, which has a maximum local flatness value $SFQR_{max}$ of less than or equal to 0.13 μm and individual SFQR values which in a peripheral area of the semiconductor wafer do not differ significantly from those in a central area of the semiconductor wafer. There is also a process for producing this semiconductor wafer, wherein the starting thickness of the semiconductor wafer is 20 to 200 μm greater than the thickness of the carrier and the semiconductor wafer is polished until the end thickness of the semiconductor wafer is 2 to 20 μm greater than the thickness of the carrier.

1 Claim, 4 Drawing Sheets

FOREIGN PATENT DOCUMENTS

| | | |
|---|---|---|
| EP | 0 754 785 | 1/1997 |
| EP | 0 755 751 | 1/1997 |
| EP | 0 776 030 | 5/1997 |
| EP | 0 887 152 | 12/1998 |

* cited by examiner

SEMICONDUCTOR WAFER WITH IMPROVED FLATNESS, AND PROCESS FOR PRODUCING THE SEMICONDUCTOR WAFER

CROSS-REFERENCE TO RELATED APPLICATIONS

Priority is hereby claimed under 35 U.S.C. 119 of German Patent Application No. 199 05 737.0 filed Feb. 11, 1999. This is a divisional patent application of U.S. Ser. No. 09/491,649 filed Jan. 27, 2000 now U.S. Pat. No. 6,458,688, and priority thereof is claimed under 35 U.S.C. 120.

BACKGROUND OF THE INVENTION

1. Field of the Invention

The present invention relates to a semiconductor wafer with improved flatness in the peripheral area and to a process for producing a semiconductor wafer of this nature. Semiconductor wafers with a high degree of flatness are suitable for use in the semiconductor industry, in particular for the manufacture of electronic components with line widths of less than or equal to 0.13 $\mu$m.

2. The Prior Art

A semiconductor wafer which is intended to be suitable in particular for the manufacture of electronic components with line widths of less than or equal to 0.13 $\mu$m must have a large number of special properties. A particularly important property is the local flatness of the semiconductor wafer. The modern stepper technology requires optimum local flatness in all partial areas of a side of the semiconductor wafer. The back-surface-referenced global (GBIR; previously also known as TTV) and local (SBIR; previously also known as LTV) flatness measurements which were in widespread use in the past are being replaced by flatness measurements which take into account the focusing ability of a stepper in all partial areas of the wafer surface. Such a flatness measurement is the SFQR (site front-surface referenced least squares/range=range of the positive and negative deviation from a front surface defined by minimizing the mean square error for a component area of defined size). The value $SFQR_{max}$ indicates the maximum SFQR value for all the component areas on a semiconductor wafer. A generally accepted rule of thumb states that the $SFQR_{max}$ value of a semiconductor wafer must be less than or equal to the possible line width on this wafer for semiconductor components which can be produced on it. If this value is exceeded, the stepper experiences focusing problems and the component in question will be lost.

The final flatness of a semiconductor wafer is generally produced by a polishing process. Equipment and processes for the simultaneous polishing of front and back surfaces of a semiconductor wafer, in order to improve the flatness values of the semiconductor wafer, have been put in place and refined. This so-called double-side polishing is described, for example, in U.S. Pat. No. 3,691,694.

Double-side polishing is also described in EP 208 315 B1. Semiconductor wafers are in carriers which are made from metal or a plastics material and have suitably dimensioned cutouts. The wafers and carriers are moved along a path which is predetermined by the machine and process parameters between two rotating polishing plates. These plates are covered with a polishing cloth, and are in the presence of a polishing fluid; and the wafers are thusly polished (in the specialist literature, carriers are also referred to as templates). The pressure forces which are employed during double-side polishing act preferentially on the semiconductor wafer which is to be polished and not on the carrier. To achieve this result, the end thickness of semiconductor wafers which have undergone double-side polishing according to the prior art is considerably thicker than that of the carriers used. For example, E. Mendel and J. R. Hause, in *IBM Technical Report* TR22.2342, presented at the *Spring Meeting of the Electrochemical Society in Boston*, Mass. on May 10, 1979, recommend that the wafers project by 2 to 3 mil (corresponds to 51 to 76 $\mu$m). This degree of projection can be ensured either by establishing the polishing time required on the basis of the material-abrasion rates determined in preliminary tests for a specific test procedure or by means of spacers arranged on the carrier. This is described in U.S. Pat. No. 5,422,316.

It is known to integrate double-side polishing into process sequences for producing semiconductor wafers. EP 754 785 A1 describes the sequence of sawing a semiconductor crystal, followed by edge rounding, double-side polishing and final polishing of the semiconductor wafers obtained. In EP 755 751 A1, it is proposed to employ a double-side grinding process between the edge rounding and the double-side polishing. The preferred embodiments described in U.S. Pat. No. 5,756,399 include the process sequence of sawing-edge rounding-grinding-alkaline etching-double-side polishing.

DE153 33 257 C1 describes the process sequence of sawing-edge rounding-grinding-etching-double-side polishing-final polishing. The etching in this case is carried out using an improved acid etching process. A common feature of these process sequences is that after the double-side polishing they lead to a semiconductor wafer which has higher local geometry values, expressed as SFQR, in the peripheral area than in the central area of the semiconductor wafer. Under certain conditions procedures such as that described in EP 187 307 A1, are aimed at compensating for the thinner edges by providing an initial dish-like geometry. This may lead to an improvement in the rear-surface-referenced geometry values GBIR and SBIR. However, such procedures represent a disadvantage with regard to the SFQR values which are relevant for the production of components.

SUMMARY OF THE INVENTION

It is an object of the present invention to provide a semiconductor wafer which is suitable in particular for the manufacture of electronic components with line widths of less than or equal to 0.13 $\mu$m and which does not have the abovementioned drawbacks with regard to the local geometry in the peripheral area, expressed as SFQR. Furthermore, the further properties of the semiconductor wafer should be at least equal to those of semiconductor wafers produced according to the prior art, and there should be advantages in terms of production costs.

The present invention is directed to a semiconductor wafer with a front surface and a back surface and flatness values based on partial areas of a surface grid on the front surface of the semiconductor wafer, which has a maximum local flatness value $SFQR_{max}$ of less than or equal to 0.13 $\mu$m and individual SFQR values which in a peripheral area of the semiconductor wafer do not differ significantly from those in a central area of the semiconductor wafer.

Preferably, in this context, there is considered to be no significant difference between individual SFQR values in the peripheral area and the central area if the arithmetic mean of the SFQR values for the peripheral area differs by at most 0.03 μm from the arithmetic mean of the SFQR values for the central area.

The present invention is also directed a process for producing a semiconductor wafer by simultaneously polishing of a front surface and a back surface of the semiconductor wafer between rotating polishing plates while a polishing fluid is being supplied, the semiconductor wafer lying in a cutout in a carrier and being held on a specific geometric path, and the carrier being of defined thickness, and the semiconductor wafer having a starting thickness prior to polishing and an end thickness after polishing, wherein the starting thickness of the semiconductor wafer is 20 to 200 μm greater than the thickness of the carrier and the semiconductor wafer is polished until the end thickness of the semiconductor wafer is 2 to 20 μm greater than the thickness of the carrier.

The essential feature of the invention is that the semiconductor wafer must be subjected to double-side polishing until the thickness of the final polished semiconductor wafer is only slightly greater than the thickness of the carrier used. The thickness difference must lie within a narrow window of from 2 to 20 μm. As the examples given below will illustrate, the discovery of this window was surprising and impossible to foresee.

The starting material used for the process is a semiconductor wafer which has been separated in a known way from a crystal. For example it may be separated from a silicon single crystal which has been cut to length and undergone circular grinding and the front and/or back surfaces of which have undergone a surface-grinding step. If desired, the crystal may be provided with one or more orientation features in order to be able to identify the crystal axes, for example a notch and/or a flat. The edge of the semiconductor wafer may also be rounded at a suitable point in the process sequence by means of a suitably profiled grinding wheel. Moreover, it is possible for the surface of the semiconductor wafers to be etched after the grinding step.

The end product of the process is a semiconductor wafer which has undergone double-side polishing and satisfies the requirements imposed on semiconductor wafers to be used as starting material for semiconductor component processes with line widths of less than or equal to 0.13 μm. And due to the reduced abrasion of material, the wafer has advantages in terms of lower production costs over the semiconductor wafers which are produced according to the prior art.

In principle, the process according to the invention can be used to produce a wafer-like body which comprises a material which can be machined with the chemo-mechanical double-side polishing process used. Examples of such materials, which are processed further predominantly in the semiconductor industry, without being limited to this industry, are silicon, silicon/germanium, silicon dioxide, silicon nitride, gallium arsenide and further so-called III-V semiconductors. Silicon in single-crystal form, for example crystallized by a Czochralski growing process or a float zone growing process, is preferred. Silicon with a crystal orientation (100), (110) or (111) is particularly preferred.

The process is particularly suitable for the production of silicon wafers with diameters of, in particular, 200 mm, 300 mm, 400 mm and 450 mm and thicknesses from a few 100 μm to a few cm, preferably from 400 μm to 1200 μm. The semiconductor wafers can either be used directly as a starting material for the production of semiconductor components or can be supplied for their intended purpose after a final polishing step according to the prior art has been carried out. Also, the wafers can be supplied after the application of layers such as back surface seals or an epitaxial coating on the wafer front surface, using silicon or other suitable semiconductor materials. Also, the wafer can be supplied after conditioning by means of a heat treatment, for example under a hydrogen or argon atmosphere. Of course, the invention can be applied not only to the production of wafers composed of a homogeneous material but also to the production of layered semiconductor substrates. These substrates are of multilayer structure, such as SOI (silicon-on-insulator) wafers and so-called bonded wafers.

The process is described further with reference to the production of a silicon wafer.

It is possible for a silicon wafer which has been sawn, for example, by means of an annular sawing or wire sawing process and which, depending on the diameter and the nature of the sawing process, exhibits damage down to a depth in the range from 10 to 40 μm, to be subjected directly to the double-side polishing step according to the invention. However, it is preferred for the sharp, and therefore highly mechanically sensitive edge of the wafer to be rounded with the aid of a suitably profiled grinding wheel. Furthermore, it is possible, in order to improve the geometry and partially abrade the destroyed crystal layers, to subject the silicon wafer to a mechanical abrasion step, such as lapping or grinding, in order to reduce the amount of material removed in the polishing step according to the invention. It is preferable for the silicon wafer to be subjected to a surface-grinding step, in which either one side is ground or both sides are ground sequentially or both sides are ground simultaneously. Sequential surface grinding of the front and back surfaces of the wafer is particularly preferred. To remove the damage to the wafer surface and edge which has inevitably been caused by the mechanical process steps and to remove any impurities which may be present, for example metal impurities which are bonded in the damaged area, an etching step may take place at this point. This etching step may be carried out either as a wet-chemical treatment of the silicon wafer in an alkaline etching mixture or acidic etching mixture or as a plasma treatment. An acid etching step in a mixture of concentrated aqueous nitric acid and concentrated aqueous hydrofluoric acid according to the disclosure of DE 153 33 257 C1 is preferred.

A particularly preferred starting material for the polishing process according to the invention is semiconductor wafers which are made from silicon and have a diameter of greater than or equal to 200 mm. These wafers are produced by sawing a single silicon crystal, followed by edge rounding, sequential surface grinding of both sides of the wafer, and removing from 10 μm to 100 μm of silicon per side. This is followed by wet-chemical etching in an acidic etching mixture, removing from 5 μm to 50 μm of silicon per side of the wafer.

A commercially available double-side polishing machine of suitable size, as described, for example, in *IBM Technical Report* TR22.2342, can be used to carry out the polishing step according to the invention. The polishing machine essentially comprises a bottom polishing plate which can rotate freely in the horizontal plane and a top polishing plate which can rotate freely in the horizontal plane. Both of these plates are covered with a polishing cloth, and, given a continuous supply of a polishing fluid of suitable chemical composition, this machine allows abrasive polishing of semiconductor wafers, in this case silicon wafers, on both sides.

It is possible to polish only one silicon wafer. For cost reasons, however, it is usual to polish a large number of silicon wafers at the same time, the number depending on the design features of the polishing machine. In this case, the silicon wafers are held on a geometric path which is determined by machine and process parameters, and by means of carriers which have suitably dimensioned cutouts for holding the silicon wafers. The carriers are in contact, for example by way of a pin gearing or an involute gearing, with the polishing machine, via a rotating inner pin ring or gear ring and an outer pin ring or gear ring which generally rotates in the opposite direction. Thus they are caused to rotate between the two polishing plates.

Examples of parameters which influence the path of the silicon wafers in relation to the top and bottom polishing plates during the polishing operation are the dimensions of the polishing plates, the design of the carriers and the rotational speeds of the top polishing plate, the bottom polishing plate and the carrier. If there is one silicon wafer in the center of a carrier, the silicon wafer moves in a circle around the center of the polishing machine. If a plurality of silicon wafers are arranged eccentrically in a carrier, the rotation of the carriers about their own axis results in a hypocycloidal path. A hypocycloidal path is preferred for the polishing process according to the invention. It is particularly preferable for from four to six carriers, which each hold at least three silicon wafers arranged at regular intervals on a circular path, to be used simultaneously.

The carriers used in the process according to the invention may be made from any material which exhibits sufficient mechanical stability when presented with the mechanical stresses, primarily the compressive and tensile stresses, caused by the drive. Moreover, the material must not be chemically and mechanically attacked to any significant extent by the polishing cloths and the polishing fluid used. This is in order to ensure a sufficiently long service life for the carriers and to avoid contamination of the polished silicon wafers. Furthermore, the material must be suitable for the production of highly planar carriers which are free from stresses and corrugations and are of the desired thickness and geometry. In principle, the carriers may, for example, be made from metal, a plastics material, fiber-reinforced plastic or plastic-coated metal. Carriers made from steel or from fiber-reinforced plastic are preferred; carriers made from stainless chrome steel are particularly preferred.

The carriers have one or more cutouts, preferably in the shape of a circle, for holding one or more silicon wafers. To ensure that the silicon wafer can move freely in the rotating carrier, the diameter of the cutout must be slightly greater than that of the silicon wafers which are to be polished. A diameter which is from 0.1 mm to 2 mm larger is preferred; a diameter which is from 0.3 to 1.3 mm larger is particularly preferred. To prevent damage to the edge of the wafer from the inner edge of the cutout in the carrier during polishing, it is sensible, and therefore preferred, for the inner side of the cutouts to be lined with a plastic coating of the same thickness as the carrier. This is described in EP 208 315 B1. Examples of suitable plastics materials are polyamide, polyethylene, polypropylene, polyvinyl chloride, polytetrafluoroethylene or polyvinylidene difluoride, which are all equally preferred. However, it is also possible, in accordance with the procedure described in EP 776 030 A2, to provide the inner side of the cutouts with a device which allows simultaneous polishing of the edge of the silicon wafer during the double-side polishing.

The preferred thickness of the carriers for the polishing process according to the invention is from 400 to 1200 $\mu$m, depending on the final thickness of the polished silicon wafers, which is ultimately dependent on the diameter of the silicon wafers and on the planned application. The characteristic feature of the invention is that the starting thickness of the silicon wafers which are to be polished is preferably 20 to 200 $\mu$m greater than the thickness of the carrier, with the range from 30 to 70 $\mu$m being particularly preferred. Also, the end thickness of the polished wafers is preferably from 2 to 20 $\mu$m greater than the thickness of the carrier, with the range from 5 to 15 $\mu$m being particularly preferred. However, slight deviations from the thickness ranges indicated are possible without any serious increase in the local flatness values SFQR being observed in the peripheral area of the wafers. The amount of silicon removed by the polishing step is from 5 to 100 $\mu$m, preferably from 10 $\mu$m to 60 $\mu$m, and particularly preferably from 20 to 50 $\mu$m in thickness.

In view of the statements made with regard to the thickness ratios, the double-side polishing step is preferably carried out in the way which is known to the person skilled in the art. Polishing cloths with a wide range of properties are commercially available. Polishing is preferably carried out using a commercially available polyurethane polishing cloth with a hardness of from 40 to 120 (Shore A). Polyurethane cloths with incorporated polyethylene fibers, lying within a hardness range from 60 to 90 (Shore A), are particularly preferred. When polishing silicon wafers, it is recommended for a polishing fluid with a pH of preferably 9 to 12, particularly preferably 10 to 11, and preferably comprising from 1% to 10% by weight, particularly preferably 1% to 5% by weight, $SiO_2$ solids content in water, to be supplied continuously. The polishing pressure preferably is from 0.05 to 0.5 bar, particularly preferably from 0.1 to 0.3 bar. The silicon abrasion rate is preferably from 0.1 to 1.5 $\mu$m/min, particularly preferably from 0.4 to 0.9 $\mu$m/min.

The percent by weight of $SiO_2$ solids content is based upon the total polishing fluid weight.

After polishing is complete, residual polishing fluid is cleaned off the silicon wafers if necessary. Then the wafers are dried and their local geometry SFQR can then be measured on a commercially available geometry gauge which operates, for example, capacitively or optically.

Depending on their intended application, it may be necessary to subject the front surface of the wafers to final polishing according to the prior art. For example, a soft polishing cloth may be used with the aid of an alkaline polishing fluid based on $SiO_2$. To obtain the very low, uniformly distributed local geometry values produced in the polishing step according to the invention, the amount of silicon removed from the wafer in this final polishing should be relatively low, for example around 0.1 to 0.7 $\mu$m in thickness.

If necessary, the semiconductor wafer may be subjected to a heat treatment at a suitable point in the process sequence, for example in order to destroy thermal donors or to anneal flaws in crystal layers which are close to the surface. Furthermore, a laser-marking step in order to identify the wafer and/or an edge-polishing step may be added at a suitable point in the process sequence. For example this may occur before or after grinding in the case of laser marking and before, during or after double-side polishing in the case of edge polishing. A series of further process steps which are required for certain products, for example the application of surface coatings of polysilicon, silicon dioxide or silicon nitride may be carried out. Also, the application of an epitaxial layer of silicon or further semiconductive materials to the front surface of the silicon wafer can also be incorporated into the process sequence at suitable points. This can be done by using methods which are also known to the person skilled in the art. In addition, it may also be desirable for the semiconductor wafer to be subjected to batch cleaning or individual-wafer cleaning according to the prior art before or after individual process steps.

There are further parameters which are customarily used to characterize wafers and are well known to the person skilled in the art. These parameters include surface defects, roughness and metal contamination of the surface of the wafers, as well as magic-mirror defects. A semiconductor wafer produced according to the present invention is superior to a semiconductor wafer produced according to the prior art.

A semiconductor wafer, in particular a silicon wafer, produced according to the invention fulfills the requirements for the production of semiconductor components with line widths of less than or equal to 0.13 µm. The process according to the invention has proven to be an optimum solution for the production of silicon wafers having the features outlined above. It is surprising and unexpected that only a relatively narrow window for the extent to which the thickness of the finished, polished wafer projects beyond the thickness of the carrier leads to certain unexpected results. These are the elimination of the thin edges, with the associated high SFQR values, which are characteristic of semiconductor wafers which have been subjected to double-side polishing according to the prior art. The geometry conditions imposed on the starting material are minimal, reducing the demands imposed on the preliminary processes. The good geometry which is produced using the step according to the invention is produced even after relatively little material has been removed. Also an improved process reliability, together with a reduced risk of fracture, results in very high yields. This is without cost-intensive steps being required for local correction of the geometry, for example by plasma etching. Therefore, the process of the invention is also economically competitive and can even be used for reworking rejected wafers and to process reclaimed wafers.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawing, wherein similar reference characters denote similar elements throughout the several views.

DETAILED DESCRIPTION OF PREFERRED EMBODIMENTS

All the examples and comparative examples described below relate to the production of silicon wafers with a diameter of either (200±0.1) mm or (300±0.2) mm, an oxygen content of $(6±1) \cdot 10^{17}$ atoms/cm$^3$ and a boron doping which leads to a resistance in the range from 10 to 20 Ωcm. The single crystals required were, using prior art methods, grown, cut to length, circular-ground and sawn into wafers with a thickness which is tailored to the end product on a commercially available wire saw. Edge rounding was followed by a surface-grinding step, on a rotary grinding machine, using diamonds with a grain size of 600 mesh, with 30 µm of silicon being removed in succession from both the front and back surfaces of the wafer. This was followed by an acid etching step using the flow etching process, in which 10 µm of silicon was removed from each wafer side simultaneously as a result of the rotating wafers being immersed in a mixture of 90% by weight concentrated nitric acid (70% by weight in aqueous solution), 10% by weight of concentrated hydrofluoric acid (50% by weight in aqueous solution) and 0.1% by weight of ammonium lauryl sulfate. The temperature of the etching mixture was set at (20±1)° C. and gaseous nitrogen was passed through. After the process steps listed, and after the polishing step described in the examples and comparative examples given below, cleaning and drying steps were carried out according to the prior art.

EXAMPLE 1

E 1d–E1k

Comparative Example 1

C 1a–C1c and C 11

There were two groups of 200 mm silicon wafers with etched surfaces and thicknesses of 770 µm and 780 µm available. Moreover, there were five carriers made from stainless chrome steel with a lapped surface and a thickness of 720 µm available, each with six circular cutouts arranged at regular intervals on a circular path, lined with polyamide and with an internal diameter of 200.5 mm. These carriers allowed 30 200 mm silicon wafers to be polished simultaneously on a commercially available double-side polishing machine.

Figure 1:
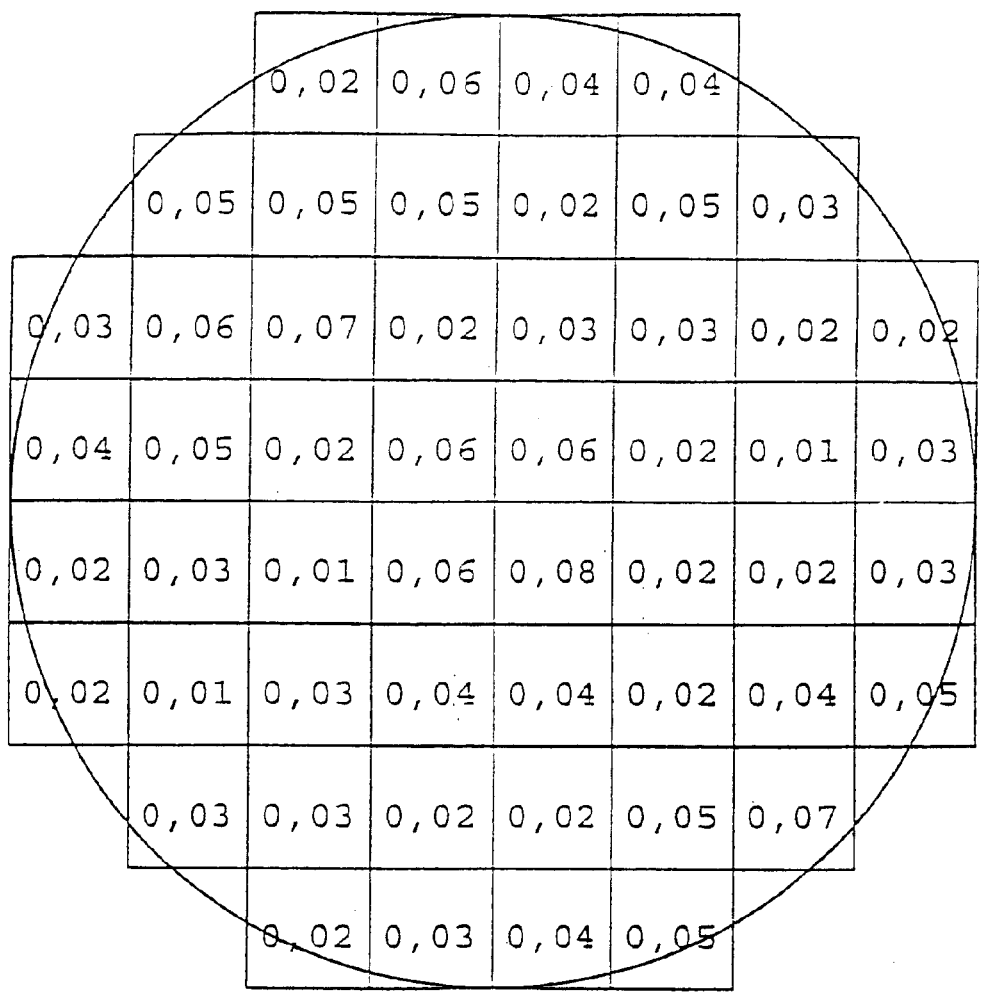
FIG. 1 shows the distribution of the local flatness values SFQR for partial areas (52 surface elements) of the size 25 mm×25 mm, which are arranged so as to cover the surface, of a silicon wafer with a diameter of 200 mm which has been produced using double-side polishing as described in Example E 1f.

The double-side polishing step was carried out using a commercially available polyurethane polishing cloth, reinforced with polyethylene fibers, with a hardness of 74 (Shore A). This polishing cloth was attached onto both the top and bottom polishing plates, and a polishing fluid with an SiO$_2$ solids content of 4% by weight and a pH of 11 was used, at a pressure of 0.15 bar. The polishing took place with the top and bottom polishing plates each at a temperature of 40° C., leading to an abrasion rate of 0.55 µm/min. A total of seven polishing runs were carried out using the silicon wafers with a thickness of 770 µm, and five polishing runs using the silicon wafers with a thickness of 780 µm, producing different levels of polishing abrasion. After polishing was complete, residual polishing fluid was cleaned off the silicon wafers, which were dried and their local geometry SFQR (grid 25 mm×25 mm) were measured on a commercially available geometry gauge with 3 mm edge exclusion, operating on the capacitive principle. In addition to the polishing abrasion, the following Table 1 also gives the difference in thickness between the finished, polished silicon wafer and the carrier ("projection") and the mean of the highest SFQR values for each of the 30 silicon wafers in each polishing run ("$SFQR_{max}$"). The SFQR values for the peripheral area of the polished silicon wafers from Examples E 1d to E 1k are not significantly higher than for the central region, as is clear for a silicon wafer from Example E 1f in FIG. 1. By contrast, the highest SFQR values for the polished silicon wafers from Comparative Examples C 1a to C 1c and C 11 lie in the peripheral area.

Data Relating to the 200 mm Silicon Wafers from Example 1/Comparative Example 1

TABLE 1

| Example1/ Comp. 1 | Carrier thickness ($\mu$m) | Starting thickness ($\mu$m) of Si wafer | Polishing abrasion ($\mu$m) | Projection ($\mu$m) | $SFQR_{max}$ ($\mu$m) |
|---|---|---|---|---|---|
| C 1a | 720 | 770 | 50 | 0 | 0.19 ± 0.03 |
| C 1b | 720 | 770 | 49 | 1.0 | 0.16 ± 0.05 |
| C 1c | 720 | 770 | 48 | 1.5 | 0.18 ± 0.03 |
| E 1d | 720 | 770 | 47 | 3 | 0.09 ± 0.01 |
| E 1e | 720 | 770 | 45 | 5 | 0.09 ± 0.01 |
| E 1f | 720 | 770 | 42 | 8 | 0.08 ± 0.01 |
| E 1g | 720 | 770 | 40 | 10 | 0.08 ± 0.02 |
| E 1h | 720 | 780 | 48 | 12 | 0.08 ± 0.01 |
| E 1i | 720 | 780 | 45 | 15 | 0.09 ± 0.02 |
| E 1j | 720 | 780 | 42 | 18 | 0.10 ± 0.02 |
| E 1k | 720 | 780 | 40 | 20 | 0.12 ± 0.03 |
| C 11 | 720 | 780 | 35 | 25 | 0.15 ± 0.04 |

Comparative Example 2

Figure 2:
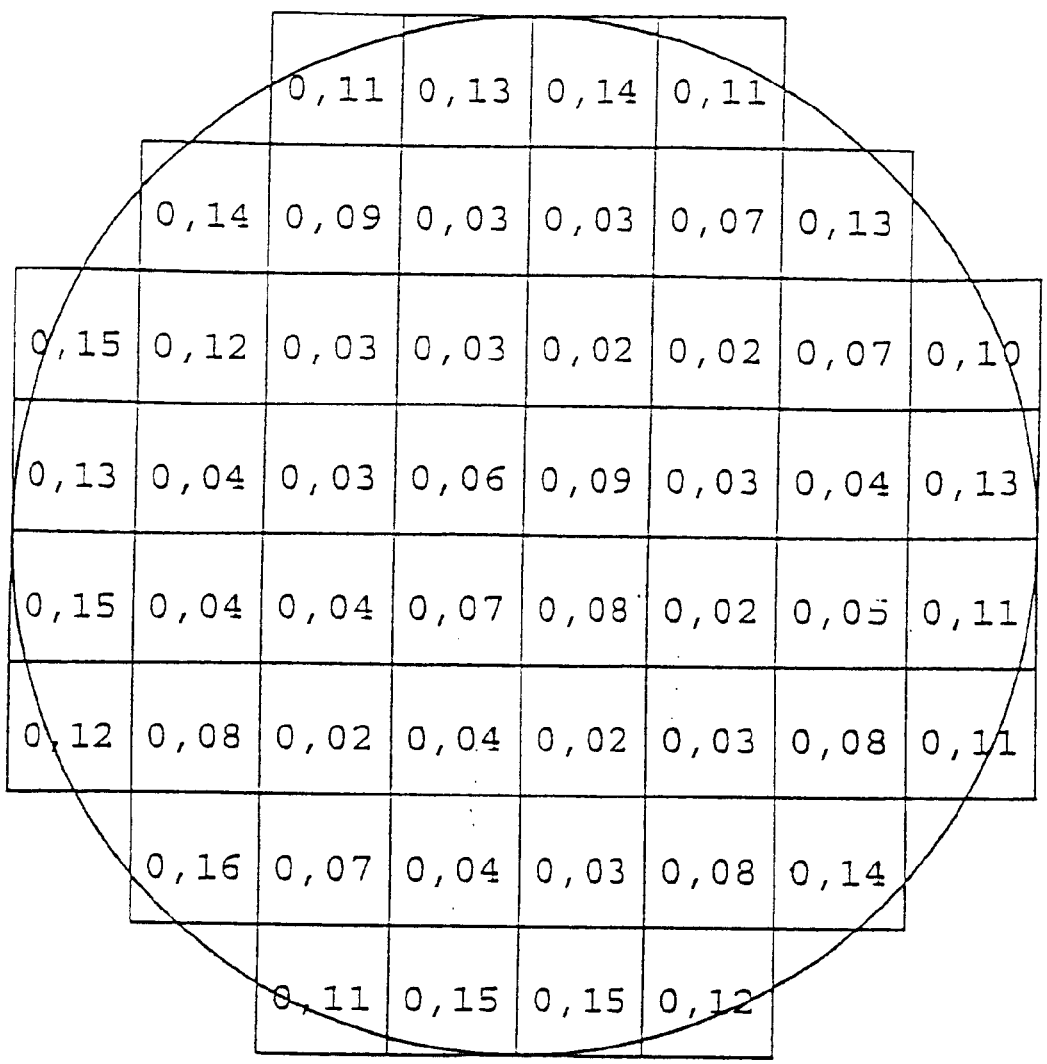
FIG. 2 shows the distribution of the local flatness values SFQR for partial areas (52 surface elements) of the size 25 mm×25 mm, which are arranged so as to cover the surface, of a silicon wafer with a diameter of 200 mm which has been produced using double-side polishing as described in Comparative Example 2c.

200 mm silicon wafers were polished as described in Example 1, except that similarly designed carriers with a thickness of 600 $\mu$m were used. The starting thickness of the silicon wafers was classified according to four groups between 680 $\mu$m and 800 $\mu$m, with 40 $\mu$m of silicon being removed from each wafer by polishing. The relevant data for the four polishing runs, each using 30 silicon wafers, are given in the Table 2 below. The SFQR values for the peripheral area of the silicon wafers from Comparative Examples 2a to 2d are significantly higher than for the central area, as is made clear by a silicon wafer from Comparative Example 2c shown in FIG. 2.

Data Relating to the 200 mm Silicon Wafers from Comparative Example 2

TABLE 2

| Comp. 2 | Carrier thickness ($\mu$m) | Starting thickness ($\mu$m) of Si wafer | Polishing abrasion ($\mu$m) | Projection ($\mu$m) | $SFQR_{max}$ ($\mu$m) |
|---|---|---|---|---|---|
| Comp. 2a | 600 | 680 | 40 | 40 | 0.17 ± 0.05 |
| Comp. 2b | 600 | 730 | 40 | 90 | 0.15 ± 0.03 |
| Comp. 2c | 600 | 770 | 40 | 130 | 0.16 ± 0.04 |
| Comp. 2d | 600 | 800 | 40 | 160 | 0.19 ± 0.05 |

EXAMPLE 2

Figure 3:
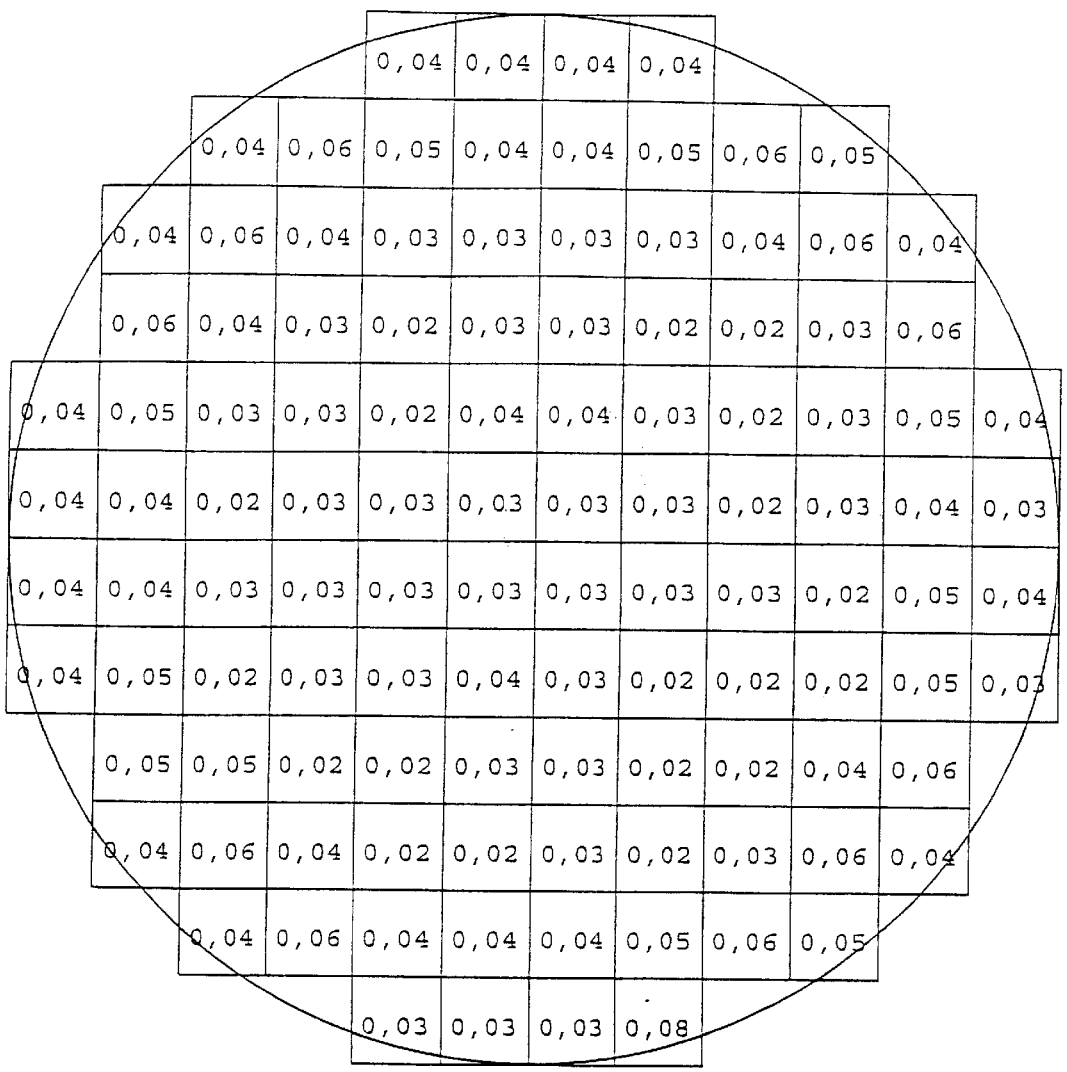
FIG. 3 shows the distribution of the local flatness values SFQR for partial areas (112 surface elements) of the size 25 mm×25 mm, which are arranged so as to cover the surface, of a silicon wafer with a diameter of 300 mm which has been produced using double-side polishing as described in Example 2.

The procedure utilized was as described in Example 1, with the following differences: 300 mm silicon wafers with etched surfaces and a thickness of 820 $\mu$m were available. In addition, there were five carriers made from stainless chrome steel with a lapped surface and a thickness of 770 $\mu$m available. Each had three circular cutouts arranged at regular intervals on a circular path, lined with polyamide and with an internal diameter of 301 mm, allowing simultaneous polishing of 15 300 mm silicon wafers. In a manner similar to the process described in Example 1, the silicon wafers were polished, with 40 $\mu$m of silicon being abraded at an abrasion rate of 0.55 $\mu$m/min. Then they were cleaned, dried and their geometry was characterized on a commercially available, capacitively operating gauge, setting 3 mm edge exclusion and a grid of 25 mm×25 mm. Details on the projection and local flatness are given in Table 3 below. The SFQR values for the peripheral area of the silicon wafers from Example 2 are not significantly higher than for the central area, as shown by FIG. 3.

EXAMPLE 3

The procedure utilized was as described in Example 2, with the two exceptions that a polishing cloth of corresponding structure but a hardness of 82 (Shore A) was used, and 42 $\mu$m of silicon were removed by polishing, at an abrasion rate of 0.82 $\mu$m/min. The relevant data are also given in Table 3 below. The SFQR values for the peripheral area of the silicon wafers from Example 3 are not significantly higher than for the central area.

Comparative Example 3

Figure 4:
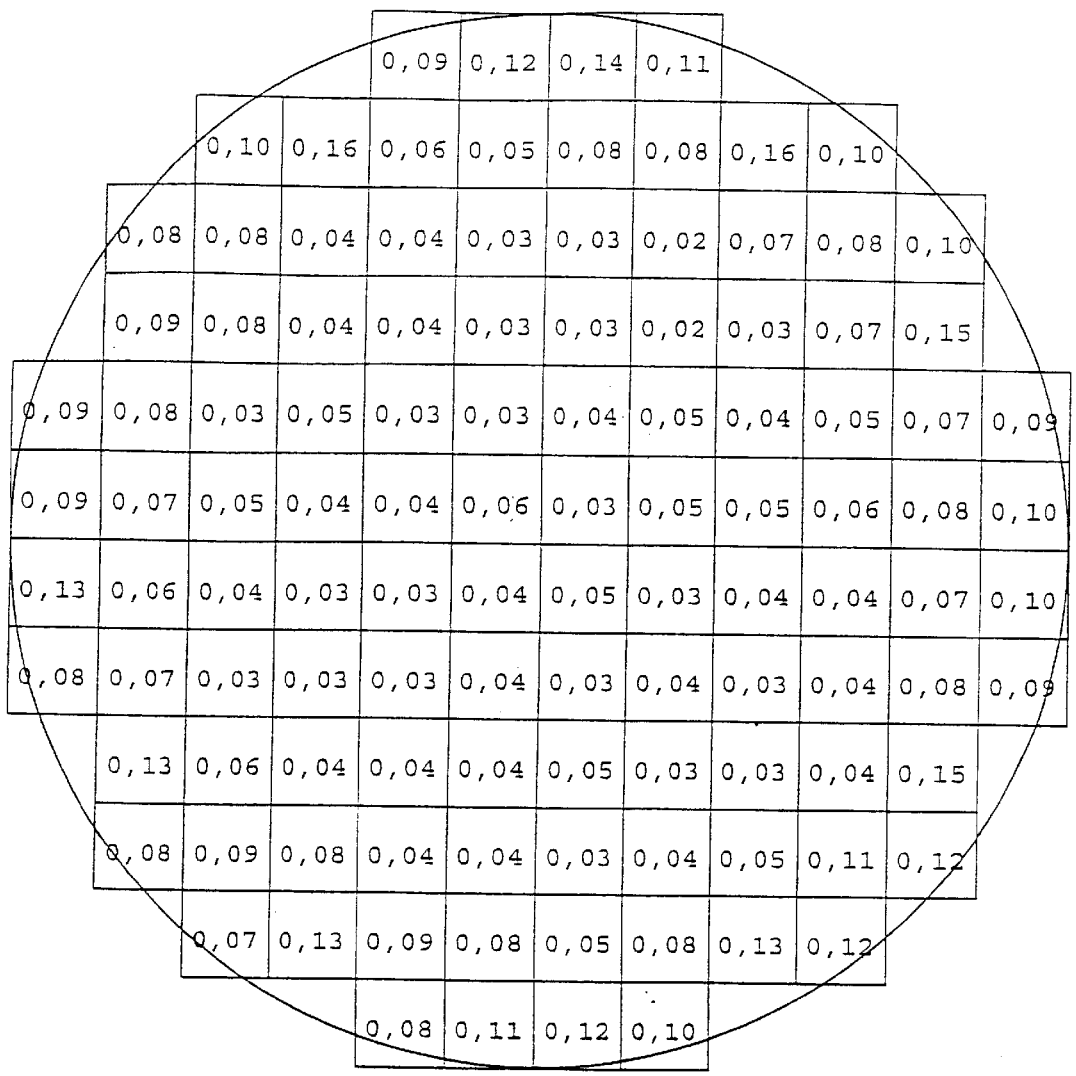
FIG. 4 shows the distribution of the local flatness values SFQR for partial areas (112 surface elements) of the size 25 mm×25 mm, which are arranged so as to cover the surface, of a silicon wafer with a diameter of 300 mm which has been produced using double-side polishing as described in Comparative Example 3.

The procedure utilized was as described in Example 2, except that the starting thickness of the 300 mm silicon wafers was 835 $\mu$m. The relevant data are again given in Table 3 below. The SFQR values for the peripheral area of the silicon wafers from Comparative Example 3 are significantly higher than for the central area, as can be seen from FIG. 4.

Comparative Example 4

The procedure utilized was as described in Comparative Example 3, except that the carrier thickness was 700 $\mu$m. The relevant data are again given in Table 3 below. The SFQR values for the peripheral area of the silicon wafers from Comparative Example 4 are significantly higher than for the central area.

EXAMPLE 4

The silicon wafers from Comparative Example 3 were again polished according to the procedure described in Example 2, but in this case the thickness of the carriers was 770 $\mu$m and 18 $\mu$m of silicon was removed by the polishing. The relevant data are again given in Table 3 below. The SFQR values for the peripheral area of the silicon wafers from Example 4 are no longer significantly higher than for the central area.

Data Relating to the 300 mm Silicon Wafers from
Examples 2 to 4 and Comparative
Examples 3 and 4

TABLE 3

| Example | Carrier thickness ($\mu$m) | Starting thickness ($\mu$m) of Si wafer | Polishing abrasion ($\mu$m) | Projection ($\mu$m) | SFQR$_{max}$ ($\mu$m) |
|---|---|---|---|---|---|
| Ex. 2 | 770 | 820 | 40 | 10 | 0.08 ± 0.01 |
| Ex. 3 | 770 | 820 | 42 | 8 | 0.07 ± 0.01 |
| Comp. 3 | 770 | 835 | 40 | 25 | 0.15 ± 0.03 |
| Comp. 4 | 700 | 820 | 40 | 80 | 0.16 ± 0.05 |
| Ex. 4 | 770 | 795 | 18 | 7 | 0.09 ± 0.02 |

Further characterization of the wafers produced is as follows. The front surfaces, back surfaces and edges of the 200 mm and 300 mm silicon wafers produced according to the examples and comparative examples described above were characterized in terms of surface defects, roughness and metal contamination and, overall, in terms of magic-mirror defects, minority carrier lives and metal contamination. This was done by using the standard methods which are known to the person skilled in the art. No statistically relevant deviations were observed between the individual test groups.

Accordingly, while a few embodiments of the present invention have been shown and described, it is to be understood that many changes and modifications may be made thereunto without departing from the spirit and scope of the invention as defined in the appended claims.

What is claimed is:

1. A semiconductor wafer with a front surface and a back surface and flatness values based on partial areas of a surface grid on the front surface of the semiconductor wafer;

said front surface grid has a maximum local flatness value SFQR$_{max}$ of less than or equal to 0.13 $\mu$m;

said front surface grid having a central area surrounded by a peripheral area; and individual SFQR values in the peripheral area of the semiconductor wafer do not differ significantly from SFQR values in the central area of the semiconductor wafer.

* * * * *